US010545058B2

(12) United States Patent
Bao et al.

(10) Patent No.: US 10,545,058 B2
(45) Date of Patent: Jan. 28, 2020

(54) PRESSURE SENSING APPARATUSES AND METHODS

(71) Applicant: The Board of Trustees of the Leland Stanford Junior University, Stanford, CA (US)

(72) Inventors: Zhenan Bao, Stanford, CA (US); Stefan Christian Bernhardt Mannsfeld, Cameron Park, CA (US); Jason Locklin, Bogart, GA (US); Chee-Keong Tee, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 593 days.

(21) Appl. No.: 15/062,841

(22) Filed: Mar. 7, 2016

(65) Prior Publication Data

US 2016/0187209 A1 Jun. 30, 2016

Related U.S. Application Data

(63) Continuation of application No. 13/229,324, filed on Sep. 9, 2011, now Pat. No. 9,281,415.

(Continued)

(51) Int. Cl.
*G01L 1/14* (2006.01)
*H01L 29/84* (2006.01)
(Continued)

(52) U.S. Cl.
CPC .............. *G01L 1/146* (2013.01); *G01L 1/148* (2013.01); *G06F 3/044* (2013.01); *G06F 3/0412* (2013.01);
(Continued)

(58) Field of Classification Search
CPC ....... G01L 9/0072; G01L 1/142; G01L 1/146; G01L 9/0075; G01L 9/12; G01L 9/0005; G01L 13/025; G01L 9/0073; G01L 1/144
See application file for complete search history.

(56) References Cited

U.S. PATENT DOCUMENTS 4,370,697 A   1/1983   Haberl et al.
5,225,959 A   7/1993   Stearns et al.
(Continued)

FOREIGN PATENT DOCUMENTS

CN   1877365 A     12/2006
CN   101059380 A   10/2007
(Continued)

OTHER PUBLICATIONS

Siegel et al., Performance analysis of a tactile sensor, Proceedings. 1987 IEEE International Conference on Robotics and Automation, Raleigh, NC, USA, 1987, pp. 1493-1499.*

(Continued)

*Primary Examiner* — Daniel R Miller
(74) *Attorney, Agent, or Firm* — Crawford Maunu PLLC (57) ABSTRACT

Sensors, sensing arrangements and devices, and related methods are provided. In accordance with an example embodiment, an impedance-based sensor includes a flexible dielectric material and generates an output based on pressure applied to the dielectric material and a resulting compression thereof. In certain embodiments, the dielectric material includes a plurality of regions separated by gaps and configured to elastically deform and recover in response to applied pressure.

13 Claims, 7 Drawing Sheets

Related U.S. Application Data (60) Provisional application No. 61/381,664, filed on Sep. 10, 2010.

(51) Int. Cl.
*G06F 3/041* (2006.01)
*G06F 3/044* (2006.01)
*H01L 51/00* (2006.01)
*H01L 51/05* (2006.01)

(52) U.S. Cl.
CPC ............ *G06F 3/0414* (2013.01); *H01L 29/84* (2013.01); *G06F 2203/04102* (2013.01); *G06F 2203/04103* (2013.01); *G06F 2203/04107* (2013.01); *H01L 51/0055* (2013.01); *H01L 51/0541* (2013.01); *Y10T 29/49002* (2015.01); *Y10T 156/10* (2015.01)

(56) References Cited

U.S. PATENT DOCUMENTS

| | | | |
|---|---|---|---|
| 6,452,514 | B1 | 9/2002 | Philipp |
| 6,646,540 | B1 | 11/2003 | Lussey |
| 7,179,561 | B2 | 2/2007 | Niu et al. |
| 7,609,178 | B2 | 10/2009 | Son et al. |
| 8,127,623 | B2 | 3/2012 | Son et al. |
| 8,272,276 | B2 | 9/2012 | Gorjanc et al. |
| 2002/0067334 | A1 | 6/2002 | Hinckley et al. |
| 2003/0072127 | A1* | 4/2003 | Zias .................. G01L 1/148 361/311 |
| 2003/0234769 | A1 | 12/2003 | Cross et al. |
| 2006/0164254 | A1 | 7/2006 | Kamizono et al. |
| 2007/0227267 | A1 | 2/2007 | Loeb et al. |
| 2008/0087069 | A1 | 4/2008 | Renken et al. |
| 2008/0132313 | A1 | 6/2008 | Rasmussen et al. |
| 2008/0259262 | A1 | 10/2008 | Jones et al. |
| 2009/0027184 | A1 | 1/2009 | Forster |
| 2009/0237374 | A1 | 9/2009 | Li et al. |
| 2010/0033059 | A1 | 2/2010 | Choi et al. |
| 2010/0105443 | A1 | 4/2010 | Vaisanen |
| 2010/0162832 | A1 | 7/2010 | Brauers |
| 2010/0178417 | A1 | 7/2010 | Connor et al. |
| 2010/0282000 | A1 | 11/2010 | Gorjanc et al. |
| 2010/0308844 | A1 | 12/2010 | Day et al. |
| 2011/0025631 | A1 | 2/2011 | Han |
| 2011/0108936 | A1 | 5/2011 | Meng et al. |
| 2012/0272751 | A1 | 11/2012 | Gorjanc et al. |

FOREIGN PATENT DOCUMENTS

| | | |
|---|---|---|
| CN | 1365501 A | 8/2008 |
| CN | 101622518 A | 11/2008 |
| CN | 101303240 A | 1/2010 |
| WO | 2006030405 A1 | 3/2006 |
| WO | 2009123388 A1 | 10/2009 |

OTHER PUBLICATIONS

Darlinski et al. "Mechanical force sensors using organic thin-film transistors," Journal of Applied Physics, vol. 97, pp. 1-4, (2005).
T.W. Lee, J. Zaumseil, Z. Bao, J.W.P. Hsu, J.A. Rogers, "Organic Light-emitting Diodes Formed by Soft Contact Lamination," Proc. Natl. Acad. Sci., vol. 101, p. 429-433, (2004).
A.L. Briseno, S.C.B. Mannsfeld, M.M. Ling, S. Liu, R.J. Tseng, C. Reese, M.E. Roberts, Y. Yang, F. Wudl, Z. Bao, "Large-area Patterning of Organic Single-crystal Arrays," Nature 2006, vol. 444, p. 913-917 (2006).
C.K. Tee, "High Sensitivity, Large Area, Flexible, Passive and Active Pressure Sensors Employing Structured Elastomeric Films," Abstract and Presentation. MRS Fall Meeting, (Dec. 2009).
L. Bergeron, "Stanford researchers' new high-sensitivity electronic skin can feel a fly's footsteps," Stanford Report, (Sep. 2010).
S.C.B. Mannsfeld, et al, "Highly sensitive flexible pressure sensors with microstructured rubber dielectric layers," Nature Materials, vol. 9, pp. 859-864 (2010).
"Electronic skin may someday restore touch," abc7news.com, 2011. Article accompanying video (1 pg).
B. Gruber, "From Star Wars to Stanford—scientists develop artificial skin," Reuters.com, Feb. 2011. Video Transcript, 1 pg.
News Release, "PPS Enters OEM Market with New Line of Digital Tactile Sensors." Pressure Profile Systems, Inc., Los Angeles, CA, 1 page (Mar. 3, 2006). http://www.pressureprofile.com.
CIPO. Office Action Search Report for related Chinese Divisional Patent Application No. 2016109867162 dated Sep. 21, 2018, 2 pages.

* cited by examiner

PRESSURE SENSING APPARATUSES AND METHODS

RELATED DOCUMENTS

This patent document is a continuation under 35 U.S.C. § 120 of U.S. patent application Ser. No. 13/229,324 and filed on Sep. 9, 2011; which claims benefit under 35 U.S.C. § 119 to U.S. Provisional Patent Application Ser. No. 61/381,664, entitled "Flexible Pressure Sensing Apparatuses and Related Methods" and filed on Sep. 10, 2010; each of these patent document and the Appendices filed in the underlying provisional application, including the references cited therein, is fully incorporated herein by reference.

FEDERALLY-SPONSORED RESEARCH AND DEVELOPMENT

This invention was made with Government Support under contract HM1582-04-1-2012 awarded by the National Geospatial-Intelligence Agency, under contract 0730710 awarded by the National Science Foundation, and under contract N00014-08-1-0654 awarded by the Office of Naval Research. The U.S. Government has certain rights in this invention.

FIELD

The present disclosure is directed to apparatuses and methods involving forms of sensing pressure.

BACKGROUND

For a wide variety of applications, significant research has been directed to approaches for sensing various forms of pressure. This research has been largely driven by a growing market for pressure-responsive electronic devices.

There are many different types of pressure sensing technologies. Many of these devices are limited in application, with respect to position, rigidity and application. For example, many pressure sensors are not flexible and cannot be implemented on curved surfaces. In addition, many sensors cannot be implemented in certain environments, such as environments susceptible to moisture. Further, many sensors are difficult and/or expensive to manufacture, and are not readily implemented in compact arrangements.

These and other characteristics have presented challenges to the implementation of sensors for a variety of applications, and have exhibited limited sensitivity.

SUMMARY

Aspects of the present disclosure relate generally to sensor devices and methods relating to the applications discussed above.

In accordance with an example embodiment, an apparatus includes a dielectric structure and a sense circuit including at least one impedance-based sensor. The dielectric structure includes an elastomeric material that exhibits a dielectric constant and, in response to pressure, compresses and thereby exhibits a changed dielectric constant corresponding to a state of compression of the elastomeric material. Each impedance-based sensor includes a portion of the dielectric structure and responds to the change in dielectric constant by providing an indication of the pressure applied to the dielectric structure adjacent the at least one impedance-based sensor. For example, such an indication may include a capacitive or current-based output corresponding to an electric field applied via the dielectric structure and altered due to the changed dielectric constant (e.g., as relative to changes in the structure of the elastomeric material under compression).

In accordance with another example embodiment, a sensor device includes a sensor having an impedance-based device with a flexible dielectric material, and that generates an output based on pressure applied to the dielectric material. The output corresponds to changes in dielectric properties of the dielectric material, corresponding to the applied pressure. In some implementations, a plurality of such sensors are included with a sensor device, and interconnecting circuits respectively couple the sensors to provide an output indicative of, for each sensor, both the pressure applied to the dielectric material and the location of the applied pressure (e.g., relative to the position of the sensor). The changes in dielectric properties may, for example, be sensed as a change in an applied capacitive field, or a change in current through a channel to which such a field is applied.

Another example embodiment is directed to a circuit including an organic semiconductor substrate, a plurality of pressure sensors at different locations on the substrate, and interconnecting conductors that couple a signal from each of the sensors for detecting an electrical response of the sensors to pressure applied thereto. Each sensor includes source and drain electrodes coupled by a channel region in the substrate and adjacent a gate dielectric, and a gate adjacent the gate dielectric. The dielectric elastically deforms in response to pressure and exhibits a dielectric characteristic that changes in response to the elastic deformation.

Another example embodiment is directed to a method of manufacturing a sensor device. A plurality of sensors is formed, each sensor respectively including an impedance-based device having a flexible dielectric material and an electrode. Each sensor is formed to generate an output at the electrode based on pressure applied to the dielectric material, with the flexible dielectric material having a plurality of dielectric material regions separated by a space. The sensors are coupled with interconnecting circuits to provide an output indicative of, for each sensor, both the pressure applied to the dielectric material and the location of the applied pressure.

The above summary is not intended to describe each embodiment or every implementation of the present disclosure. The figures, detailed description and claims that follow more particularly exemplify various embodiments.

BRIEF DESCRIPTION OF THE DRAWINGS

Aspects of the present disclosure may be more completely understood in consideration of the detailed description of various embodiments of the present disclosure that follows in connection with the accompanying drawings, in which.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims.

DETAILED DESCRIPTION

The present disclosure relates to pressure sensors, pressure-sensing devices and apparatuses, methods for manufacturing pressure sensors, and to methods of using pressure sensors. While the present disclosure is not necessarily limited to such devices and applications, various aspects of the disclosure may be appreciated through a discussion of examples using these and other contexts.

One aspect of the present disclosure, and in accordance with an example embodiment, relates to a type of sensor device comprising a plurality of sensors, each including an impedance-based device having a compressible elastic dielectric material and circuit nodes separated by the dielectric material. Each sensor is configured to generate an output in response to impedance changes due to an amount of pressure applied to the dielectric material. Interconnecting circuits are respectively configured to couple the sensors and to provide an output indicative of pressure applied to the elastic dielectric at the respective sensors. For example, organic field-effect transistors can be manufactured with such a dielectric material, with the conductivity of the transistors (e.g., in their ON state) being related to the pressure. Accordingly, changes in pressure as amounting to either or both of increases and decreases in pressure are readily sensed.

The dielectric material can be implemented, or tuned, to suit different applications. In some implementations, spaces or pockets are formed within the dielectric material and/or between individual patterned regions of the dielectric material. The spaces/pockets may be filled with a fluid, gas, or other material exhibiting compression properties that are different than that of the dielectric material, and facilitate the elastic deformation and recovery of the dielectric material in response to applied pressure. For example, the spacing and/or air pockets can be tailored to enhance the dielectric material's ability to return to an original shape, after deformation. In certain implementations, the cross-sectional shape of the dielectric can be set to facilitate responsiveness/recovery to deformation, and to set the sensitivity of the shape to applied pressure. For instance, modifying the shape of the cross-section of a dielectric material can allow greater compression distance per unit force, thus increasing the sensitivity of the dielectric material to pressure.

Another approach to tuning characteristics of the dielectric material involves using different materials in different portions of a sensor and/or a combination of materials for a single sensor. For example, polydimethylsiloxane (PDMS), piezoelectric elastic materials, pyroelectric elastic polymers and ferroelectric elastic polymers can be patterned and used as discussed herein, alone or in combination with one another.

In addition, various portions of a sensor device can be tuned differently, with respect to material, shape and/or formation of spaces or air pockets. These approaches can be used to form sensors having a range of different sensing abilities. These sensing abilities can be tuned, for example, to a particular application or to a particular user. For example, by using air in the spaces/gaps, the displaced volume has a lower dielectric constant (=1.0) than an elastomer/dielectric (e.g., PDMS of ~3.0). Therefore, the increase in capacitance in the structured film arises from the reduction in the distance between the two electrode plates, and is enhanced further by the increase in dielectric constant.

Other aspects of the present disclosure are directed to a type of pressure-sensing apparatus that includes a circuit with an organic semiconductor substrate and/or other semiconductor material such as inorganic nanowires which are also flexible. The circuit with such deformable material provides sufficient material displacement in one or more directions (as in stretching and/or bending) for the indication of pressure. The circuit can include an elastic gate dielectric on the substrate configured to deform in response to pressure applied thereto, and a plurality of pressure sensors at different locations on the substrate. Each such sensor includes a FET-like arrangement with source and drain electrodes and a gate. For example, the source and drain electrodes can be coupled by a channel region that is in the substrate and adjacent the gate dielectric, and with the gate on the gate dielectric and configured to apply a bias to the channel region. The amount of the bias is responsive to deformation of the elastic gate dielectric in the channel region. The circuit is further configured with interconnecting conductors configured and arranged to couple a signal from each of the sensors, the signal being indicative of the deformation of the elastic gate dielectric via the applied bias.

Yet another aspect is directed to a type of apparatus or device having a three-dimensional sensitivity. The device comprises a transparent substrate having a plurality of sensors, with each sensor including electrodes electrically coupled by a compressible elastic dielectric material. The compressible elastic dielectric material compresses in response to pressure applied thereto, with each sensor being configured to exhibit an increased capacitance between the electrodes in response to the compression of the compressible elastic dielectric. The device can include a transparent conductive shielding material on the compressible elastic dielectric material, a light source configured to pass light corresponding to an image for viewing through the substrate and shielding material, and interconnecting circuits that respectively couple the sensors and provide a pressure-indicative output.

In some implementations, one or more of a material and shape of a dielectric elastomer is set to facilitate a response time to on and off pressure on the order of 10 ms or less, allowing for successive pressure sequences to be detected easily. For example, human finger actions are often physiologically limited to approximately 300 ms per action, such that response times faster than 300 ms facilitate the repeated application of pressure (e.g., taps).

In various embodiments, an elastomer/dielectric film as discussed herein is micropatterned to mitigate visco-elastic creep and increases in relaxation times after compression, such as may relate to irreversible entanglement of polymer chains and the lack of a deformable surface. In connection with one or more such embodiments, it has been discovered that spaces (e.g., voids or gaps) between micro-structured portions of the film facilitate elastic deformation upon application of external pressure that, absent the spaces, may effect visco-elastic creep (e.g., a time-dependent increase in strain) in the film at its thickness. This facilitates the film's ability to store and release energy reversibly. Accordingly, various embodiments are directed to a sensor having an elastomer/dielectric film having separate regions patterned with respect to one another and a space therebetween, to facilitate reversible elastic deformation upon an applied pressure. This spacing and patterning (e.g., and the shape of the film) can be set to suit a particular application and an expected applied pressure, relative to the material used and mechanical properties thereof.

In certain embodiments, the elastic dielectric material for a sensor as discussed herein has a microstructure that connects circuit nodes of the sensor and a width dimension that is less than about 50 microns for certain implementations, less than about 30 microns for other implementations, and less than about 5 microns for certain other implementations. The dielectric layer may be a solid elastic dielectric layer for sensing the applied pressure, or may include a plurality of microstructures having gaps therebetween (e.g., filled with a non-solid material as discussed herein).

Other aspects of the present disclosure are directed toward apparatuses and methods involving at least one sensor implemented consistent with one or more of the above sensor types, in which the apparatus involves at least one of: a prosthetics device in which the sensor provides an output for operating the prosthetics device; a robotics device in which the sensor provides an output for facilitating automatic movement of the robotics device; and a medical device for insertion into a subject, in which the sensor provides an output for detecting pressure in the subject corresponding to pressure applied to one of the sensors.

Other embodiments are directed to electronic skin that can be used in artificial intelligence devices that come into direct contact with humans, and in biomedical applications such as prosthetic skin. In order to mimic the tactile sensing properties of natural skin, large arrays of sensors as discussed herein are formed on a flexible and stretchable substrate, such as by using the biocompatible elastomer PDMS.

According to other aspects, in addition to displays, certain embodiments consistent with the instant disclosure use three-dimensional touch sensors on or as part of surfaces of input devices, which may include curved surfaces. Such devices include, for example, a computer mouse, rollable keyboards, or a gaming interface device. In some implementations, the sensors operate to replace mechanically-moving components such as buttons, and may be configured to provide an output corresponding to such components.

Another example embodiment is directed to the detection and prevention of excessive pressure on body tissue, such as during insertion of medical or surgical devices or cameras, using a flexible bio-neutral pressure sensor (e.g., near the tip of an instrument such as a camera head). This pressure sensitivity effectively gives feedback to the operator in a manner akin, for example, to sensing pressure on one's own skin.

In another embodiment, postoperative or post traumatic organ or tissue swelling is detected and monitored with a flexible bio-compatible pressure sensor patch using a pressure sensing device as discussed herein. The sensor patch may, for example, be further coupled to a small bio-compatible radio frequency identification (RFID) device, which communicates pressure characteristics using wireless communications.

Power for the sensors as discussed herein can be obtained in a variety of manners. In some implementations, an external power supply or a battery are used. In other implementations, wireless power devices such as radio frequency devices that draw power from wireless signals are implemented with the sensors and used to power the sensors. In still other implementations, structuring is applied to piezoelectric films and a piezoelectric voltage that results from the exertion of pressure on the device powers the device.

Sensors as discussed herein may be implemented in a variety of applications. For example, one such application includes touch screen devices such as hand-held devices, televisions and computer devices, in which the sensor passes light (e.g., using a transparent elastomer material such as PDMS). Other applications are directed to force-sensing methods, such as resistive pressure sensors using conductive filler particles in elastomers, or quantum tunneling composites. Certain applications are directed to sensing changes in pressure, such as may be exhibited in a pressure vessel upon the development of a leak (e.g., a loss in pressure can be detected as a change in conductivity due to dielectric changes). Certain embodiments of the present disclosure are directed to sensing devices, wherein at least one sensor includes an elastic dielectric that is configured to exhibit an impedance change due to elastic capacitance (e.g., elastic capacitor as a discrete element or part of a capacitive circuit). Other applications are directed to medical applications, such as for sensing pressure within a body, or for prosthetic devices. Still other applications are directed to detecting pressure exerted on surfaces, such as by wind on a car or airplane body, and related deformations therein (e.g., to monitor for material stress), and can be used to understand frictional forces exerted by fluids (e.g., using a multi-sensor approach as discussed herein). Other applications involve sensing pressure in highly curved surfaces, such as in tubes which flow gasses and/or liquids, or in pressure vessels. Other applications are directed to portable, highly sensitive weighing scales, low fluid flow rate sensors, underwater touch sensors, pressure sensing systems for detecting driver fatigue by detecting low periods of low-pressure (or no) contact forces on curved surfaces of steering wheels during vehicle motion, and strain gauges (e.g., between movable joints).

Sensors as discussed in connection with one or more example embodiments can be manufactured using a variety of approaches, and can be implemented in a variety of applications. In one implementation, a sensor is manufactured on plastic substrates in a roll-to-roll process, which allows for high throughput and thus facilitates low commercialization costs. Accordingly, an elastomeric type roll can be manufactured with pressure-sensing electrodes in high-speed, facilitating the rapid manufacture of devices. Such sensors made on flexible substrates can be implemented with a variety of applications, such as curvilinear surface applications.

Figure 1:
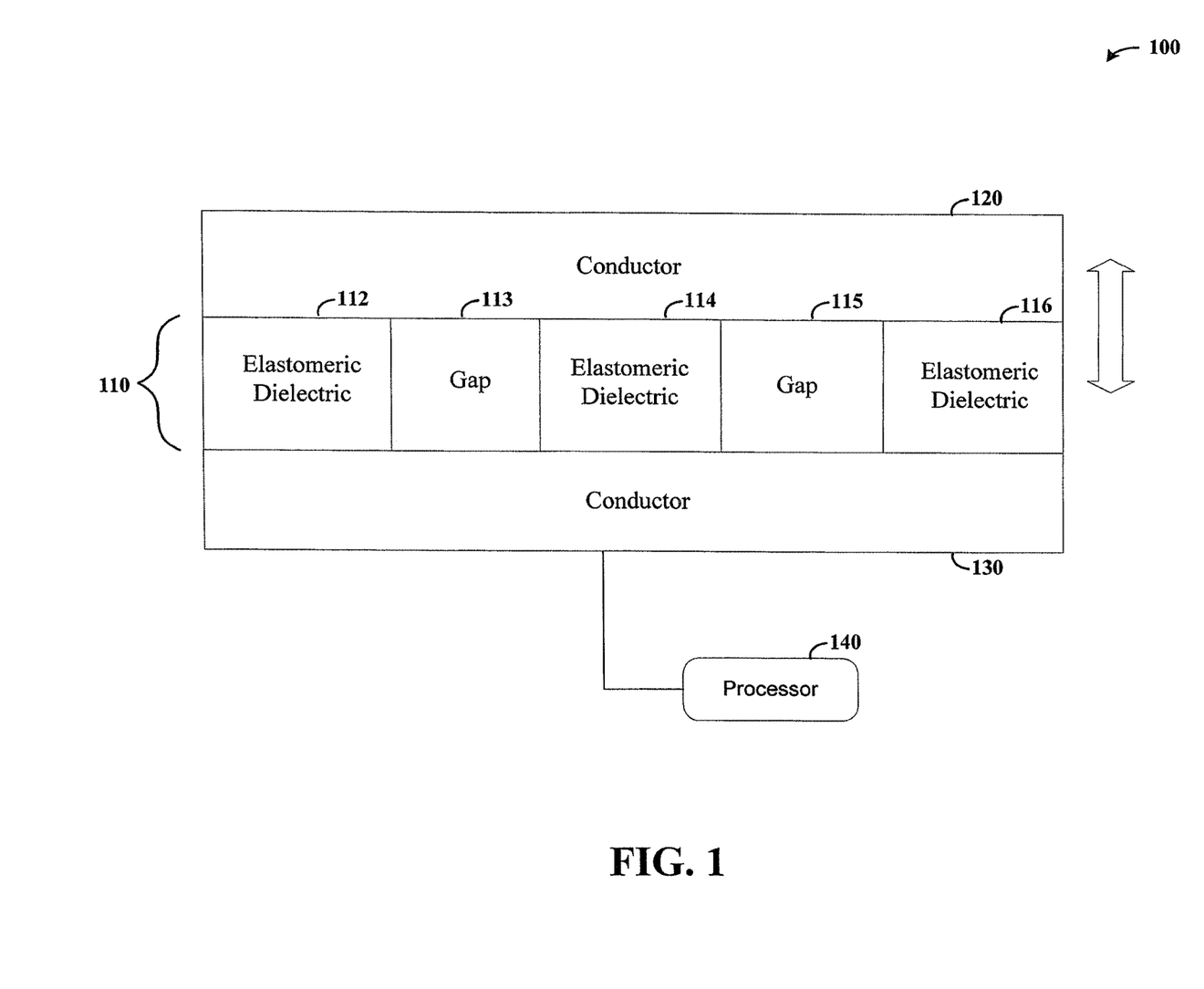
FIG. 1 shows a thin film sensor, according to an example embodiment of the present disclosure.

Turning now to the figures, FIG. 1 shows a pressure thin film sensor device 100, according to an example embodiment of the present disclosure. The device 100 includes a dielectric layer 110 that is configured and arranged to exhibit different electrical properties under pressure. An upper electrode 120 and a lower electrode 130 are separated from one another by the dielectric layer 110.

The dielectric layer 110 includes several regions of elastomeric dielectric material, with regions 112, 114 and 116 shown by way of example. The elastomeric regions are separated from one another by gap regions 113 and 115, which are defined laterally by sidewalls of the elastomeric regions 112, 114 and 116, and may include a material such as air, another gas, or another compressible material. By choosing the material type in the gap regions (or, e.g., lack of a material), elastic compression of the elastomeric regions can be achieved, facilitating pressure sensitivity and fast recovery to compression. The dielectric layer 110 exhibits different dielectric characteristics based upon an amount of pressure applied thereto, such as via movement of the respective electrodes 120 and 130 relative to one another as exemplified by a double-ended arrow. A capacitance between the electrodes can be used as an indication of a state of compression of the dielectric layer 110, and therein as an indication of pressure.

Accordingly, as the elastomeric regions 112, 114 and 116 are compressed (or expanded) due to an applied pressure (increasing or decreasing pressure), an electrical characteristic at the one of the electrodes 120 and 130 can be used as an indication of this compression via a related change in dielectric properties of the elastomeric regions and/or an effective dielectric constant of the entire dielectric layer 110.

In various implementations, the sensor device 100 is implemented with an array of such devices, for sensing pressure and position. For example, by arranging a multitude of such sensors as part of a pressure-sensitive device, the output of respective sense electrodes for each sensor can be used to detect pressure at the sensors. Moreover, relative pressure can be determined at the respective sensors by detecting variations in the outputs at the sense electrodes of each sensor.

In certain embodiments, the device 100 includes a processor 140 that processes an output at the lower electrode 130 to provide an indication of pressure applied to the dielectric layer 110 (e.g., as pressure applied to the upper electrode 120, with the lower electrode 130 being held stationary). In some implementations, the processor 140 uses the indication of pressure to carry out processing tasks, such as for determining pressure characteristics and/or generating an output such as a control signal that is based upon detected pressure.

Figure 2A:
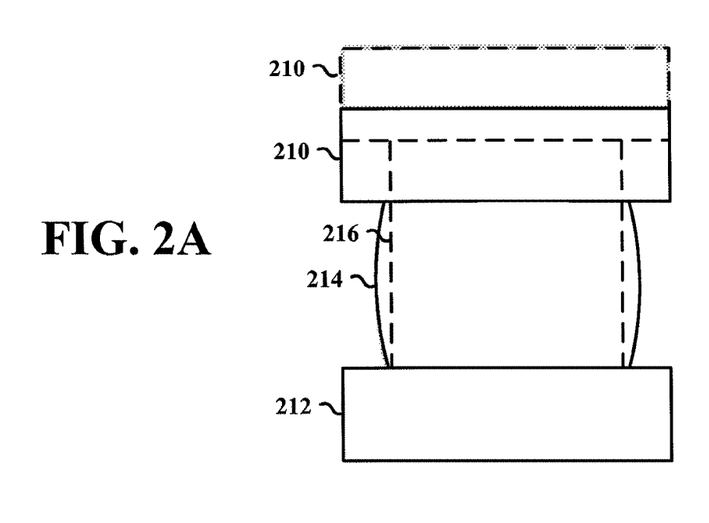
FIGS. 2A-2D show cross-sectional views of example sensors and respective elastomer shapes, in accordance with various example embodiments of the present disclosure.
Figure 2B:
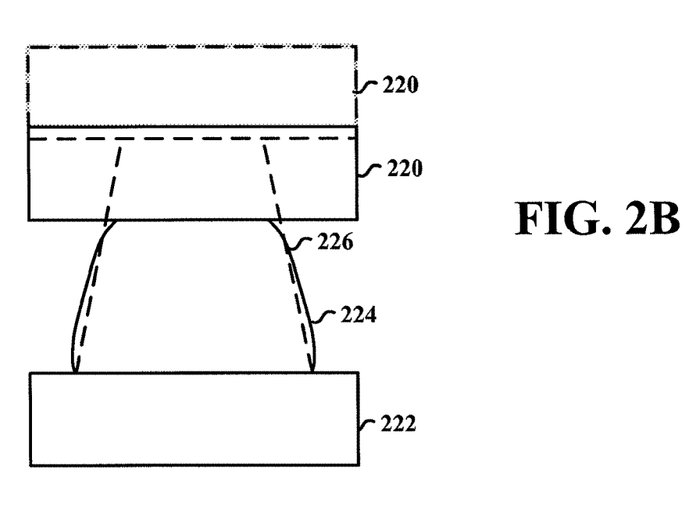

FIGS. 2A-2D show cross-sectional views of example sensors and respective elastomer shapes, in accordance with various example embodiments of the present disclosure. The respective sensors are shown having a common upper and lower region (e.g., two electrodes, as shown in FIG. 1, and moving in accordance with the arrows as shown), with differently-shaped elastomer materials being responsive in different manners to the application of a common pressure. Referring to FIG. 2A, upper and lower portions 210 and 212 are separated by an elastomer material that compresses as shown at 214, and having a generally vertical sidewall as shown at 216 in an uncompressed shape. As with corresponding upper portions in FIGS. 2B-2D, upper portion 210 is shown at both the uncompressed and compressed positions. Referring to FIG. 2B, upper and lower portions 220 and 222 are separated by an elastomer material that compresses as shown at 224, and having an inclined sidewall as shown at 226 in an uncompressed shape. Relative to compressed elastomer material 214 in FIG. 2A, the compressed elastomer material 224 exhibits a greater vertical compression in accordance with the different shape.

Figure 2C:
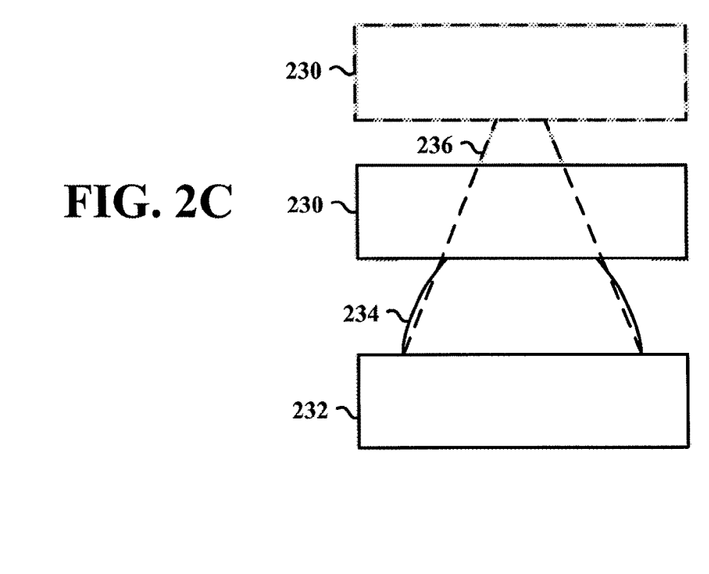
Figure 2D:
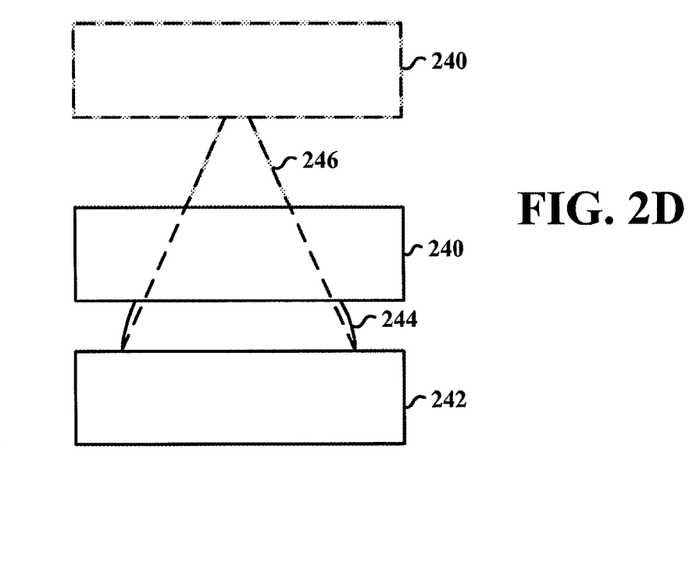

FIGS. 2C and 2D show sensors having elastomer materials with increasing degrees of inclination, and exhibiting increasingly greater deflection in response to a common pressure. Accordingly, FIG. 2C shows upper and lower portions 230 and 232 separated by an elastomer material that compresses as shown at 234, and exhibits an uncompressed shape as shown at 236. Similarly, FIG. 2D shows upper and lower portions 240 and 242 separated by an elastomer material that compresses as shown at 244, and exhibits an uncompressed shape as shown at 246.

As shown in FIGS. 2A-2D, modifying the shape of the elastomer cross-section can thus allow greater compression distance per unit force, thus increasing the sensitivity of the elastomer layer to pressure. In this context, various embodiments are directed to the implementation of elastomers having cross-sections that tune, or set, characteristics of a sensor in which the elastomers are used. Moreover, elastomers having different cross-sections can be used in a common device to set different pressure-sensing characteristics for different portions of the device. In various implementations, the cross-section of an elastomer is altered to set the sensitivity to pressure, and can be set to sense pressure of less than 1 kPa.

In some implementations, the elastomeric layer as shown in FIGS. 2A-2D is shielded from the external environment by a conductive layer that keeps electric field lines within the elastomeric layer. Compressing the elastomer layer increases the effective dielectric constant of the material between electrodes (e.g., referring to FIG. 2A, upper and lower portions 210 and 212 can be implemented as electrodes). This increases the capacitance between the electrodes and thus, the pressure can be measured by the increase in capacitance.

Figures 3A, 3C:
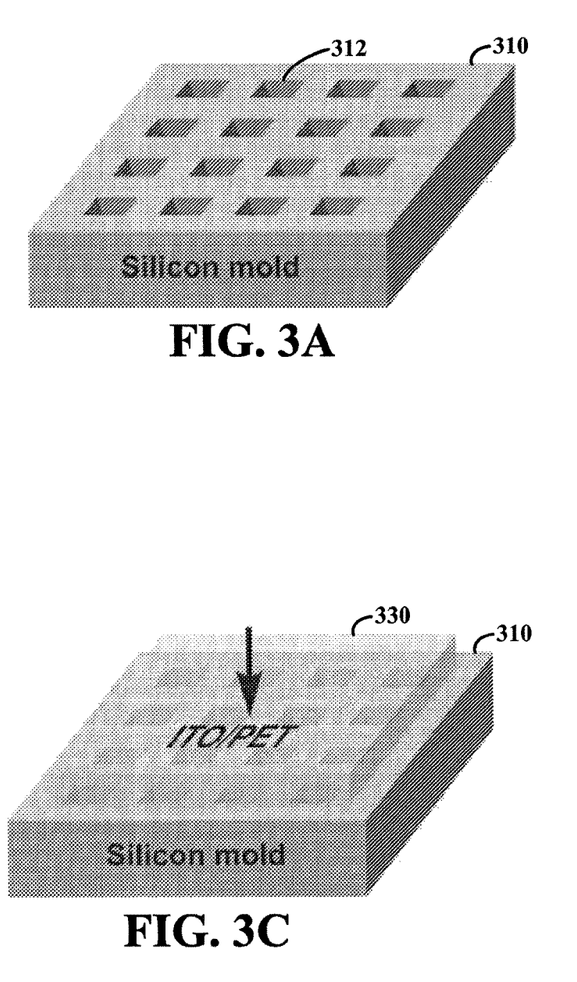
FIGS. 3A-3D show a sensor having a micro-structured polydimethylsiloxane (PDMS) film at various stages of manufacture, in accordance with various example embodiments of the present disclosure.
Figure 3B:
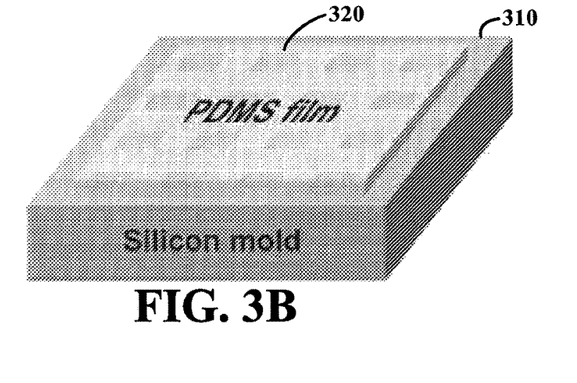
Figure 3D:
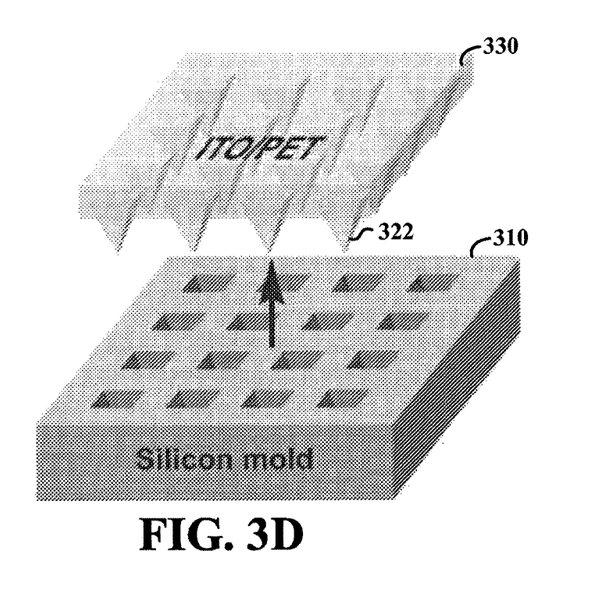

FIGS. 3A-3D show a sensor device having a microstructured polydimethylsiloxane (PDMS) film, at various stages of manufacture, in accordance with various example embodiments of the present disclosure. FIGS. 3A-3D show a mold 310 (e.g., Silicon) having a plurality of inverse features 312. Referring to FIG. 3B, a PDMS film 320 is formed on the mold 310. At FIG. 3C a laminated film 330, such as indium tin oxide (ITO) coated poly(ethyleneterephthalate) (PET) substrate, is formed on the PDMS film 320, and the PDMS film is cured (e.g., cross-linked) under even pressure (e.g., at a temperature of about 70° C. for about three hours). At FIG. 3D, the laminated film 330 is removed, with individual portions of the PDMS film 320, including portion 322 as labeled for example, are shown formed on the film. The shape of the portion 322 is set by the shape of the inverse features (312), and set to suit the particular application with respect to compressibility.

The micro-structures in the PDMS film 320 can be manufactured in a generally uniform (2-3% pitch fidelity) arrangement across the mold 310. These features can be replicated with high quality on very thin (e.g., <100 μm) and highly flexible plastic sheets. This approach can be used to ensure large-area compatibility of a pressure sensor, with respect to the tallest three PDMS features (322) determining a contact plane. In addition, the PDMS features (322) can be set at a relatively small size (e.g., 3-6 μm or less in width, and less than 10 μm in height). In some implementations, a small glass plate is used to apply uniform pressure and improve lamination. Resulting film sensitivity can be achieved at about 0.55 kPa-1, with little to no hysteresis, and can detect weights of less than 20 mg and/or a pressure of about 3 Pa. Resulting film relaxation times can be achieved in the millisecond range.

Figure 4:
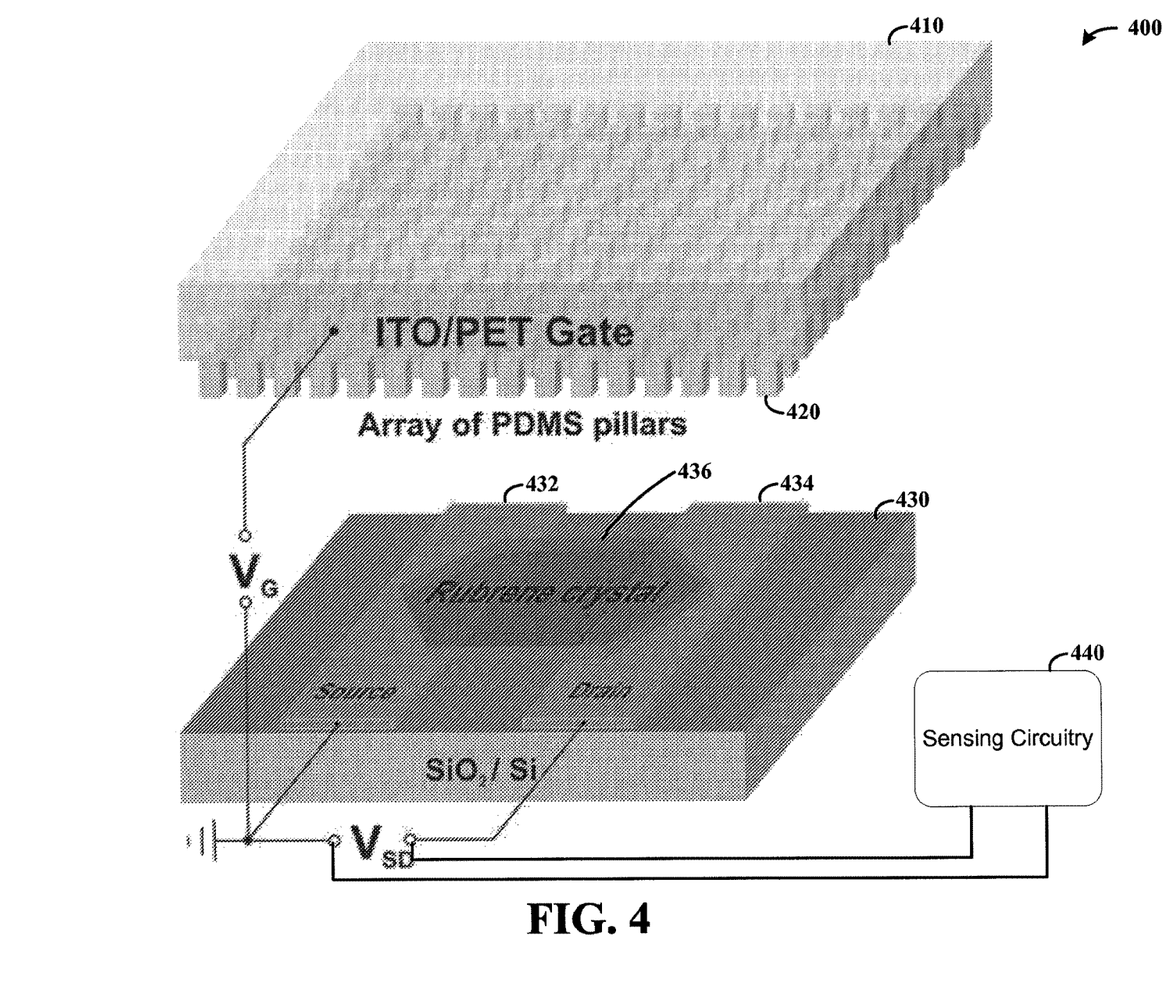
FIG. 4 shows a pressure-sensitive OFET device, in accordance with another example embodiment of the present disclosure.

FIG. 4 shows a pressure-sensitive organic field-effect transistor (OFET) device 400, in accordance with another example embodiment of the present disclosure. The device 400 includes and ITO-coated PET gate electrode 410, with an array of PDMS pillars 420 forming a dielectric material. On a silicon dioxide/silicon substrate 430 (e.g., in a silicon-on-insulator arrangement, with the silicon in a thin layer upon an oxide), source and drain regions 432 and 434 are formed, and coupled by a rubrene crystal channel region 436. The device 400 is shown with the gate electrode separated from the underlying regions by way of example, with the upper gate electrode 410 being brought into proximity with the substrate 430 to contact the PDMS pillars 420 with the underlying source and drain electrodes 432 and 434. The dielectric material (PDMS pillars 420) exhibits dielectric characteristics corresponding to a (compressive) pressure applied thereto, such as via the gate 410 or the underlying substrate 430, with the resulting current conducted between the source 432 and drain 434 being indicative of the dielectric characteristics and, therein, the pressure applied to the PDMS pillars 420.

In some embodiments, sensing circuitry 440 is coupled across the source and drain electrodes 432 and 434, for detecting current therebetween and, accordingly, a degree of compression of the PDMS pillars 420. The sensing circuitry 440 can be integrated with the device 400, or coupled as a separate device. Moreover, where a multitude of sensors are used (e.g., in a matrix), such as by implementing an array of sensors 400, the sensing circuitry 440 may be coupled to two or more of these sensors to detect and/or process outputs thereof. In some implementations, the circuitry 440 provides a relatively simple output, such as may correspond to an actual measurement or response detected at $V_{SD}$, or may include processing circuitry that provides a more complex output characterizing the applied pressure, which may also be indicative of one or both of an amount of pressure and a location of the applied pressure.

The device 400 may be manufactured in a variety of manners, such as discussed above, and may be arranged to suit particular applications. For example, the PDMS pillars 420 may be formed in different shapes to set the sensitivity of the device 400, such as by tapering an end of the pillars as shown in one or more of FIGS. 2A-2D. In some implementations, the source and drain electrodes 432 and 434 are bottom contact gold electrodes and are formed on a highly n-doped silicon oxide wafer. The rubrene single crystal may, for example, be grown using physical vapor transport and laminated on top of the bottom contact gold electrodes. Such a crystal may, for example, be formed to exhibit a field-effect hole mobility on the order of 1 cm2/Vs. Other thin-film organic semiconductors with similar characteristics may also be similarly implemented.

A variety of different types of materials can be used to make sensors, in accordance with embodiments as discussed herein. In a particular example embodiment, a capacitive matrix-type pressure sensor is formed with all plastic components, apart from conductive or metal-type electrodes, by sandwiching a micro-structured dielectric film such as PDMS between two electrodes such as sheets of PET substrates (e.g., 25 µm thick) having conductors (e.g., vacuum-deposited aluminum metal lines (150 µm wide) that serve as address and data lines). The structure can be partitioned into sections (e.g., quadrants) of micro-structured PDMS film.

In some embodiments, a highly-stretchable material is used as a substrate to support patterned dielectric pillars to decrease signal spill-over from adjacent sensors (e.g., such that the translation of pressure upon a portion of the material/sensor to adjacent portions/sensors is mitigated or eliminated). For instance, such a material can be used in place of and/or with PET where implemented in various embodiments above.

In other embodiments, control circuitry is used to determine spillover based upon pressure sensed at different sensors within a matrix, using an algorithm-type input to determine an actual position of an applied pressure, relative to pressures sensed at different sensors. Referring to FIG. 4, this approach can be implemented with sensing circuitry 440, when connected to a multitude of sensors. Moreover, such an approach can be used to interpolate the position of an applied pressure at or between sensors.

Other embodiments are directed to the implementation of a matrix-type pressure sensor in a device that collects pressure information at multiple points. These approaches can be used to collect different types of inputs for a variety of devices.

Figure 5:
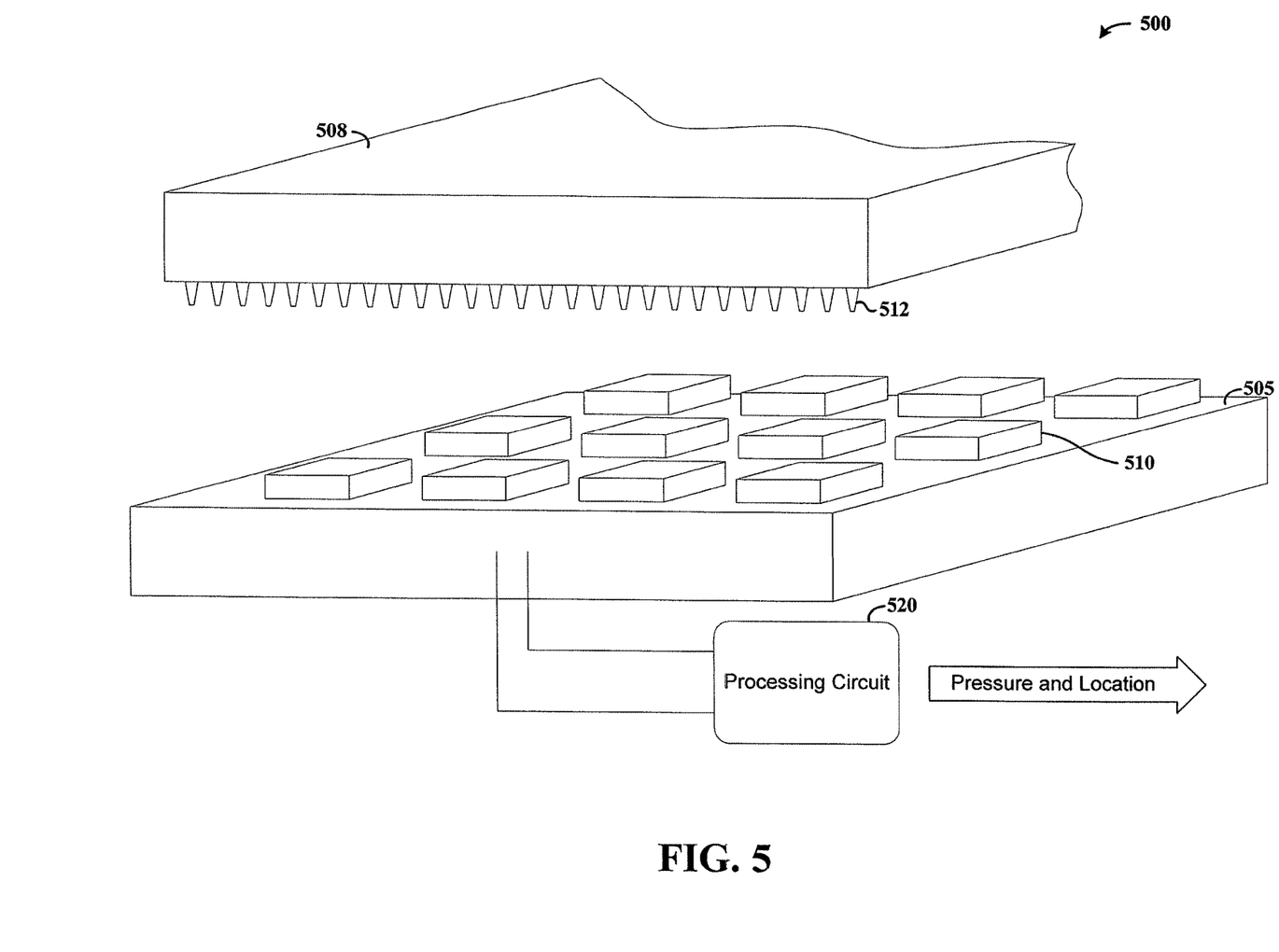
FIG. 5 shows an array of pressure-based sensors, in accordance with another example embodiment of the present disclosure.

Referring now to FIG. 5, a sensor device 500 includes an array of pressure-based sensors on a substrate 505, in accordance with another example embodiment of the present disclosure. The array is shown by way of example as having twelve sensors, with sensor 510 labeled by way of example. Over the sensors is an array of dielectric regions, including region 512 illustrated for example, which are connected to a flexible substrate 508. The substrate 508 and related dielectric regions are shown in cut-away view and separated from the underlying sensors for illustration, with the dielectric regions (512) being brought into contact with the sensors for operation.

Each of these sensors may be implemented, for example, with a sensor such as shown in FIG. 4. Outputs of the sensors are coupled to a processing circuit 520, which processes the outputs to provide pressure and location information. For example, each of the sensors (including sensor 510) may be coupled directly to the processing circuit 520, or an array of interconnecting circuits in the substrate 505 may be made to provide an addressable output corresponding to a position of the respective sensors (e.g., in rows and columns), with a single lead connected to the processing circuit.

When pressure is applied to the flexible substrate 508, the dielectric regions (512) compress at a region near the applied pressure, and the underlying sensors (510) sense the applied pressure via a change in dielectric properties of the dielectric regions near the sensor. By processing outputs of the sensors at processing circuit 520, an indication of both a location and an amount of pressure applied to the flexible substrate 508 can be provided. The sensors (510) exhibit electrical changes based on the deformation and resulting changes in dielectric properties, thus providing an indication of the pressure. In this context, a three-dimensional pressure-sensing device is provided, sensing both position (e.g., in an x-y direction of a plane in which the sensors lie) and pressure (e.g., in a z direction into/about perpendicular to the aforesaid plane).

Figure 6:
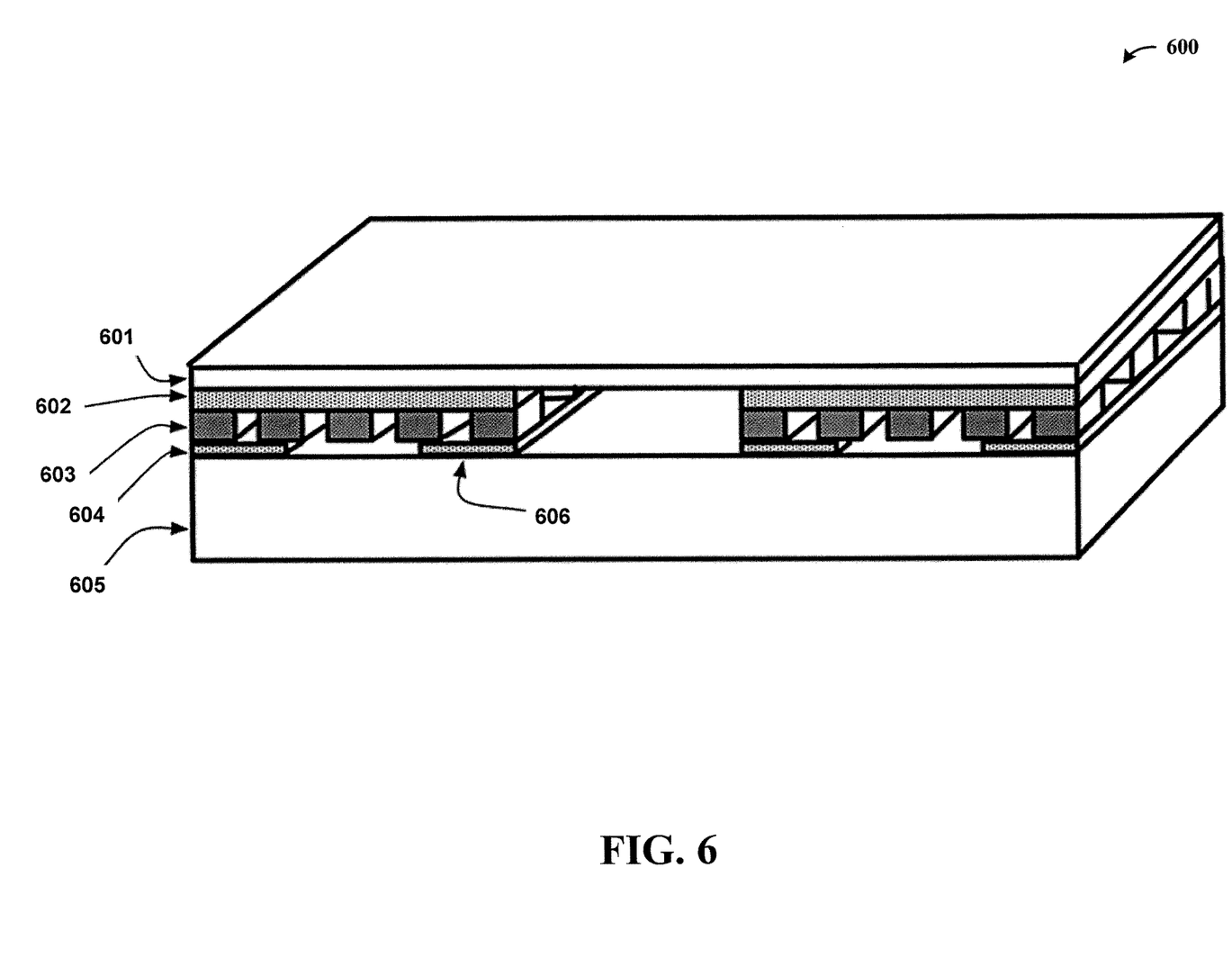
FIG. 6 shows a capacitive device, in accordance with another example embodiment of the present disclosure.

Referring now to FIG. 6, a capacitive device 600 is shown, in accordance with another example embodiment. The device 600 may, for example, be implemented in accordance with the approach shown in FIG. 1, or with other arrangements of electrodes. The device includes an encapsulating substrate 601 over a layer 602, which may be implemented as a capacitive plate and/or for shielding a dielectric layer 603. As shown, layer 602 is patterned at locations of underlying sense regions, but may be implemented as a continuous layer, for particular applications (e.g., for an array of sensors, to read out pressure and position and mitigate cross-talk between sensors). In addition, the conductive shielding may be left floating, or set at ground potential.

The dielectric layer 603 has alternating regions of an elastomeric dielectric material and gap regions including a compressible substance such as air. The dielectric layer 603 is formed over respective electrodes, including electrode 604 and 606 mounted on a substrate 605, which may form capacitors with the layer 602.

Another example embodiment is directed to a pressure sensor that senses both vertical loads and shear force, which may be implemented using an approach as shown, for example, in FIGS. 1, 4 and 6. Shear force information is detected by grouping of oriented pressure sensor fields with either asymmetric microstructures or asymmetrically-arranged symmetric microstructures in groups (e.g., by orienting pressure sensor fields in North, West, South and East directions with groups of 2×2 superpixels). The response to vertical loads in the four sub-units of such a superpixel will be the same, thus any signal difference originates from in-plane (shear) stress exerted onto the sensor surfaces. The signal from the grouped sensors is calibrated and used to determine the sheer force vector and magnitude. Using this approach, pressure and shear forces can be detected and used, for example, to detect slip.

Figure 7:
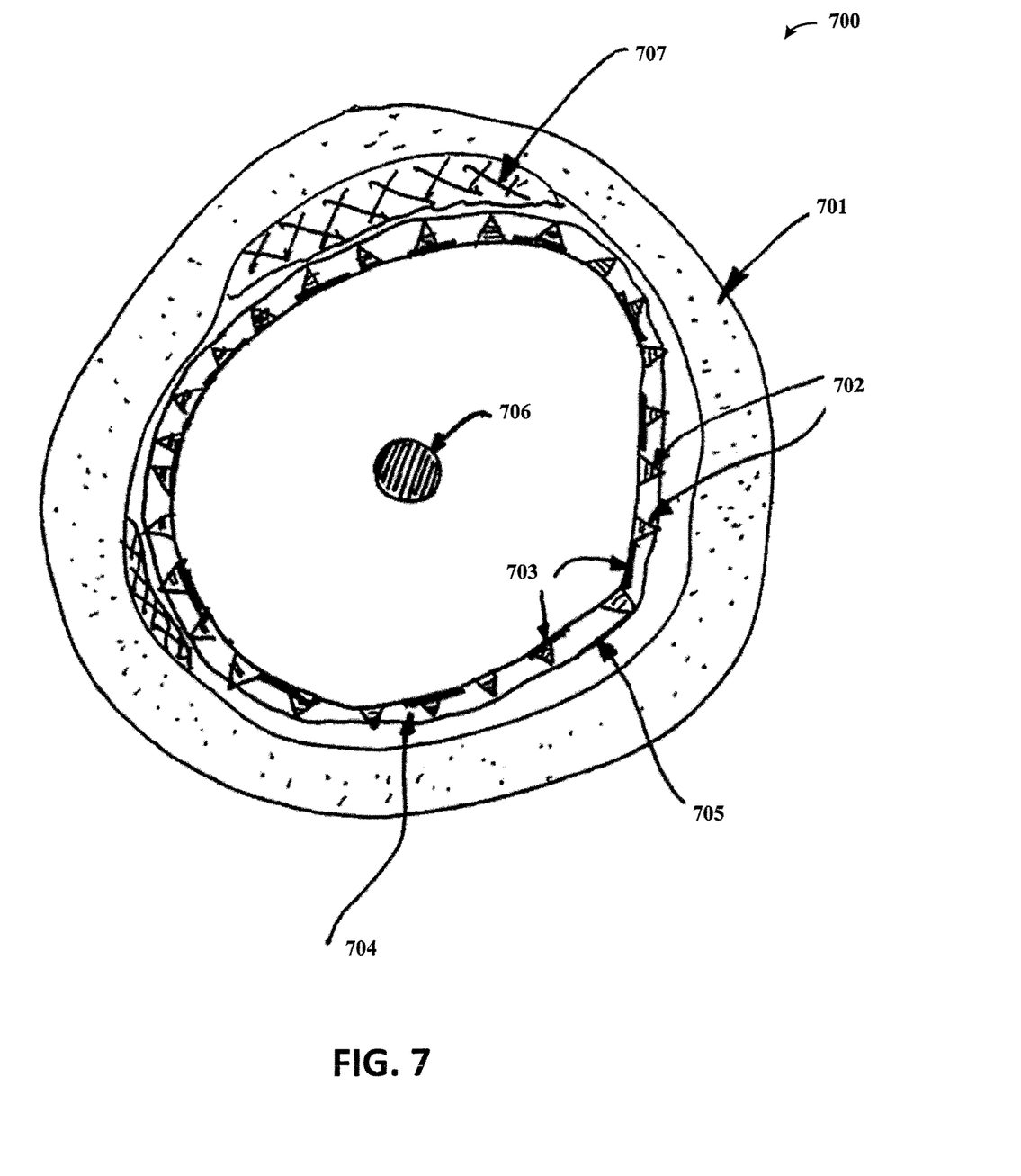
FIG. 7 shows an intra-arterial/intra-venous pressure sensing device, in accordance with another example embodiment.

FIG. 7 shows an intra-arterial/intra-venous pressure sensing device 700, in accordance with another example embodiment. The device 700 can be used, for example, to detect pressure within a variety of different tissues, such as to produce surface maps of cell hardness. The device is configured for placement within an arterial or venial vessel wall 701, and includes a structured dielectric material 702, sense electrodes 703 and counter electrodes 704 located along the structured dielectric material 702, and a sensor substrate 705. The device may be placed using, for example, a catheter guide wire 706 and an inflatable balloon, and be used for detecting pressure differences along the wall, such as may be present due to fatty deposits or diseased tissue as represented at 707, or can measure overall cell hardness. The sensors can be electrically coupled to the guide wire 706 or a lead therewith, for providing a sensor output.

The embodiments and specific applications discussed herein may be implemented in connection with one or more of the above-described aspects, embodiments and implementations, as well as with those shown in the above-referenced provisional patent document, the Appendices that form part of that document, and the references cited therein. This underlying provisional patent document, including the Appendices, as well as the references cited therein are fully incorporated herein by reference.

While the present disclosure is amenable to various modifications and alternative forms, specifics thereof have been shown by way of example in the drawings and will be described in further detail. It should be understood that the intention is not to limit the disclosure to the particular embodiments and/or applications described. For example, various different types of elastomer or dielectric materials can be used in different shapes. Different sensing approaches can be interchanged with those shown, such as by detecting a change in capacitance or a change conductivity of a channel region. In addition, the sensors described herein can be implemented for a variety of different types of pressure-sensing or pressure-dependent applications. The intention is to cover all modifications, equivalents, and alternatives falling within the spirit and scope of the present disclosure.

What is claimed is:

1. An apparatus comprising:
   a dielectric structure including a plurality of elastomeric regions separated from one another by space regions, the elastomeric regions being configured and arranged, in response to pressure, to compress and thereby exhibit a changed effective dielectric constant corresponding to a state of compression of the elastomeric regions, wherein the respective elastomeric regions are configured and arranged to exhibit a different effective dielectric constant, relative to other ones of the elastomeric regions, in response to different pressures being applied to the respective elastomeric regions; and
   a sense circuit including a plurality of impedance-based sensors and including at least one electrode adjacent the dielectric structure, each impedance-based sensor including a portion of the dielectric structure and configured and arranged to respond to the change in dielectric constant by providing an indication of the pressure applied to the dielectric structure adjacent each sensor, wherein the elastomeric regions are configured and arranged to compress in response to applied pressure including pressure of 1 kPa or a change in the applied pressure of 1 kPa and arranged with the space regions and the sense circuit to provide respective outputs from each elastomeric region, wherein the elastomeric regions have width and thickness dimensions and including at least one of the plurality of elastomeric regions having a cross-section with a width dimension being less than 50 microns, and the elastomeric regions are configured and arranged to, relative to one another and a distance between the elastomeric regions, reversibly store and release energy via elastic deformation of the respective elastomeric regions, and wherein during the state of compression, the plurality of elastomeric regions are located between the at least one electrode and another electrode adjacent the dielectric structure.

2. The apparatus of claim 1, wherein the elastomeric regions are configured and arranged to, relative to one another and with a distance between the elastomeric regions, reversibly store and release energy via elastic deformation of the respective elastomeric regions, and each of the one or more of the elastomeric regions has a cross-sectional width dimension of less than 5 microns and has a tapering shape.

3. The apparatus of claim 1, wherein each sensor is to provide an output indicative of a state of compression of the elastomeric region adjacent the sensor, and the sense circuit is to provide an indication of a position of the respective sensor providing each output.

4. The apparatus of claim 1, wherein the at least one of the plurality of elastomeric regions has a width dimension being greater than 5 microns and less than 50 microns, said width dimension corresponding to a cross section of said at least one of the plurality of elastomeric regions.

5. The apparatus of claim 1, wherein the elastomeric regions are further configured and arranged to compress in response to applied pressure, or a change in the applied pressure of 3 Pascals.

6. The apparatus of claim 1, wherein the sense circuit is to sense pressure differences from an arterial or venial vessel wall, and wherein the at least one electrode includes two opposing electrodes, each adjacent the dielectric structure.

7. A method, comprising:
   forming a plurality of sensors in an array, each sensor respectively including an impedance-based sensor having a dielectric material and opposing electrodes separated by the dielectric material by a distance of less than 100 um in an uncompressed state, each sensor configured and arranged to compress in response to applied pressure including pressure of 1 kPa or a change in the applied pressure of 1 kPa and generate an output from at least one of the opposing electrodes based on pressure applied to the dielectric material and changes, responsive to the applied pressure, in a dielectric property of an elastomeric material in the dielectric material, wherein the elastomeric material is configured and arranged with a plurality of elastomeric regions; and coupling the sensors with interconnecting circuits configured and arranged to provide an output indicative of, for each sensor, both the pressure applied to the dielectric material and a location of the applied pressure that is distinct relative to locations of other sensors in the array, wherein the elastomeric regions have width and thickness dimensions and including at least one of the plurality of elastomeric regions having a cross-section with a width dimension being less than 50 microns, and the elastomeric regions are configured and arranged to, relative to one another and a distance between the elastomeric regions, reversibly store and release energy via elastic deformation of the respective elastomeric regions, and wherein during the state of compression.

8. The method of claim 7, wherein the plurality of sensors in the array include a micro-structured dielectric material between the opposing electrodes.

9. The method of claim 8, further including forming the micro-structured dielectric material by partitioning the micro-structured dielectric material into sections, wherein the micro-structured dielectric material includes microstructures that are shaped to set a pressure sensitivity of the sensors.

10. The method of claim 7, further including applying sequential applications of pressure to the sensor array, with at least one of the applications of pressure including a pressure change of less than 1 kPa, and wherein the sensors and the interconnecting circuits provide outputs indicative of the pressure applied and the location of the applied pressure for each sequential application.

11. The method of claim 10, the method further including, in response to each sequential application of pressure, the dielectric material compressing at a cross-section thereof and recovering therefrom in less than 300 msecs, thereby, exhibiting a changed dielectric constant corresponding to a state of compression of the dielectric material.

12. An apparatus comprising:

an elastomer including a plurality of elastomeric regions separated from one another by space regions, each of the elastomeric regions being configured and arranged to compress in response to applied pressure including pressure of 1 kPa or a change in the applied pressure of 1 kPa and thereby exhibit a changed dielectric constant corresponding to a state of compression of the elastomer regions; and a sense circuit including a plurality of impedance-based sensors, each impedance-based sensor including a portion of the elastomer and having opposing electrodes separated by the portion of the elastomer by a distance of less than 100 um before the state of compression, each sensor configured and arranged to respond to the changed dielectric constant by providing an indication of the pressure applied to the portion of the elastomer between the opposing electrodes of the respective sensor, wherein the elastomeric regions have width and thickness dimensions and including at least one of the plurality of elastomeric regions having a cross-section with a width dimension being less than 50 microns, and the elastomeric regions are configured and arranged to, relative to one another and a distance between the elastomeric regions, reversibly store and release energy via elastic deformation of the respective elastomeric regions, and wherein during the state of compression.

13. The apparatus of claim 12, wherein the respective elastomeric regions are configured and arranged to exhibit a different effective dielectric constant, relative to other ones of the elastomeric regions, in response to different pressures being applied to the respective elastomeric regions.

* * * * *